US 6,630,388 B2

(12) United States Patent
Sekigawa et al.

(10) Patent No.: US 6,630,388 B2
(45) Date of Patent: Oct. 7, 2003

(54) DOUBLE-GATE FIELD-EFFECT TRANSISTOR, INTEGRATED CIRCUIT USING THE TRANSISTOR AND METHOD OF MANUFACTURING THE SAME

(75) Inventors: Toshihiro Sekigawa, Tsukuba (JP); Kenichi Ishii, Tsukuba (JP); Eiichi Suzuki, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 10/095,936

(22) Filed: Mar. 13, 2002

(65) Prior Publication Data

US 2002/0130354 A1 Sep. 19, 2002

(30) Foreign Application Priority Data

Mar. 13, 2001 (JP) ........................................ 2001-069673
Mar. 13, 2001 (JP) ........................................ 2001-069779

(51) Int. Cl.[7] ..................... H01L 21/331; H01L 21/336; H01L 21/20; H01L 21/3205
(52) U.S. Cl. ..................... 438/396; 438/197; 438/243; 438/585; 438/386
(58) Field of Search ............................. 438/197, 199, 438/585, 593, 275, 156, 173, 192, 206, 212, 268, 386, 243, 142, 211, 669, 737, 738, 942, 396

(56) References Cited

U.S. PATENT DOCUMENTS

| | | | | |
|---|---|---|---|---|
| 4,900,396 A | * | 2/1990 | Hayashi et al. | 438/705 |
| 5,324,673 A | * | 6/1994 | Fitch et al. | 438/156 |
| 5,413,948 A | * | 5/1995 | Pfiester et al. | 438/152 |
| 5,920,777 A | * | 7/1999 | Choi et al. | 438/257 |
| 5,940,698 A | * | 8/1999 | Gardner et al. | 438/197 |
| 6,033,959 A | * | 3/2000 | Fu | 438/289 |
| 6,087,225 A | * | 7/2000 | Bronner et al. | 438/275 |
| 6,218,255 B1 | * | 4/2001 | Fritzinger et al. | 438/386 |
| 6,245,629 B1 | * | 6/2001 | Tobben | 438/386 |
| 6,297,086 B1 | * | 10/2001 | Hegde et al. | 438/243 |
| 6,329,290 B1 | * | 12/2001 | Zhao | 438/700 |
| 6,399,469 B1 | * | 6/2002 | Yu | 438/595 |
| 6,406,962 B1 | * | 6/2002 | Agnello et al. | 438/268 |
| 6,429,062 B1 | * | 8/2002 | Rubin | 438/199 |
| 6,451,652 B1 | * | 9/2002 | Caywood et al. | 438/257 |

FOREIGN PATENT DOCUMENTS

FR  1244142 A1 * 9/2002

* cited by examiner

Primary Examiner—Matthew Smith
Assistant Examiner—Chuong A Luu
(74) Attorney, Agent, or Firm—Oblon, Spivak, McClelland, Maier & Neustadt, P.C.

(57) ABSTRACT

A double-gate field-effect transistor includes a substrate, an insulation film formed on the substrate, source, drain and channel regions formed on the insulation film from a semiconductor crystal layer, and two insulated gate electrodes electrically insulated from each other. The gate electrodes are formed opposite each other on the same principal surface as the channel region, with the channel region between the electrodes. The source, drain and channel regions are isolated from the surrounding part by a trench, forming an island. Gate insulation films are formed on the opposing side faces of the channel region exposed in the trench. The island region between the gate electrodes is given a width that is less than the length of the channel region to enhance the short channel effect suppressive property of structure.

2 Claims, 17 Drawing Sheets

DOUBLE-GATE FIELD-EFFECT TRANSISTOR, INTEGRATED CIRCUIT USING THE TRANSISTOR AND METHOD OF MANUFACTURING THE SAME

BACKGROUND OF THE INVENTION

1. Field of the Invention

The present invention relates to an insulated-gate field-effect transistor having a suppressed short channel effect, particularly to a double-gate field-effect transistor, and to an integrated circuit employing the transistor and a method of manufacturing the transistor.

2. Description of the Prior Art

In order to achieve insulated-gate field-effect transistors with shorter channel lengths, it is necessary to suppress the short channel effect (the threshold voltage roll-off that occurs when the channel length is shortened). The double-gate field-effect transistor disclosed by Japanese Patent No. 2,021,931 has a device structure for achieving that. FIG. 1 is a cross-sectional view of a conventional double-gate field-effect transistor.

With reference to FIG. 1, the transistor includes a substrate 501, a lower gate insulation film 502, a source region 503, a drain region 504, a channel region 505, an upper gate insulation film 506, an insulation film 507, an upper gate electrode 508, a lower gate electrode 509, a source electrode 530, and a drain electrode 540. This structure is a highly effective method of suppressing the short channel effect. This is because the upper gate electrode 508 and the lower gate electrode 509 shield the channel region 505. By thereby suppressing the effect that the drain field has on the potential distribution at the interface region between the source and the channel, it is possible to stabilize just the channel potential, even if the channel is shortened, thereby suppressing the threshold voltage roll-off caused by the short channel effect.

However, to enable this feature of the structure to function effectively in a high-performance integrated circuit device, there must be no positional misalignment between the channel region and the two gate electrodes. Misalignment increases parasitic capacitance and resistance that, together with the fluctuations thereof, can lead to a marked degradation in device performance.

With the structure of the conventional double-gate field-effect transistor in which the vertically arranged gate electrodes, separated by the channel region, together with the source and drain regions, are not provided on the same principal surface, self-alignment cannot be employed, making it difficult to form the two gate electrodes in alignment with the channel, source and drain regions. It has therefore been necessary to utilize the available positioning accuracy with respect to the disposition of the lower gate electrode and channel region, and this has given rise to the problem of performance degradation arising from such factors as increased parasitic capacitance and fluctuations thereof. Another drawback is that when the fabrication is used as an integrated circuit device, because the upper and lower gate electrodes are not positioned on the same principal surface, the wiring becomes complex. To resolve such problems, the present invention proposes a double-gate field-effect transistor having the configuration shown in the plan view of FIG. 2 and the cross-sectional view of FIG. 3.

With further respect to the double-gate field-effect transistor of this configuration, normally chemical mechanical polishing (CMP) is used for surface planarization. CMP and other planarizing processes can easily cause contamination and damage, and are followed by washing that itself involves many process steps. It is therefore desirable to reduce the number of planarizing steps as much as possible. Thus, another object of the present invention is to reduce the number of steps used to planarize surfaces using CMP and the like.

SUMMARY OF THE INVENTION

To achieve the above object, the present invention provides a double-gate field-effect transistor comprising a substrate, an insulation film formed on the substrate, source, drain and channel regions formed on the insulation film and each made from a semiconductor crystal layer, and two insulated gate electrodes electrically insulated from each other, the two gate electrodes being formed in opposition on a principal surface of the insulation film on which the channel region is formed, with the channel region between the gate electrodes.

With reference to FIGS. 3 and 4, a semiconductor crystal layer 3 is prepared that is isolated from the substrate by an insulation film 2. A semiconductor crystal layer island comprising at least a source region and a drain region, and a channel region adjacent to the source and drain regions, is isolated from the surrounding portion by a trench. Gate insulation films 71 and 72 are formed on opposing side faces of the channel region exposed in the trench, and this is followed by the formation of gate electrodes 81 and 82. These steps produce a structure provided with a semiconductor-layer island, and gate electrodes provided in the trench, with the gate electrodes being mutually isolated from each other by the gate insulation film. The semiconductor island region 9 between the gate electrodes has a predetermined width that preferably is less than the length of the channel region. It is desirable to make this width small enough to enhance the short channel effect suppressive property of the semiconductor-layer island.

Thus, a first principal point of the present invention is that a double-gate field-effect transistor comprising a substrate, an insulation film 2 formed on the substrate and a source region 10, drain region 11 and channel region 9 constituted from a semiconductor crystal layer 3 formed on the insulation film 2 provided on a substrate, has two insulated gate electrodes electrically insulated from each other, the two gate electrodes facing each other on the same principal surface of the channel region, with the channel region therebetween.

A second principal point of the present invention is that the double-gate field-effect transistor that is the first principal point is used to realize a high-performance integrated circuit.

A third principal point of the present invention is that the above integrated circuit includes double-gate field-effect transistors having channel regions of different width.

Also, to enable the width of the channel region to be substantially doubled by applying the same input signal to the two insulated gate electrodes, a fourth principal point of the present invention is that the double-gate field-effect transistor is operated by electrically connecting the two insulated gate electrodes thereof.

By using an input of different signals to the two insulated gate electrodes that are connected in parallel with the gate voltage characteristics mutually balanced, to thereby enable the transistor to be used as two transistors, a fifth principal point of the present invention is that the double-gate field-effect transistor is operated by electrically connecting a different electric potential to the two insulated gate electrodes thereof.

Since the short channel effect can be suppressed by optimizing the electric potential at one of the two insulated gate electrodes, a sixth principal point of the present invention is to operate the double-gate field-effect transistor according to the fifth principal point by connecting a substantially fixed electric potential to one of the two insulated gate electrodes thereof.

A seventh point of the present invention relates to a method of manufacturing the double-gate field-effect transistor by steps that include a step of forming a trench in a semiconductor layer that is isolated from a substrate by a first insulation layer and is formed on a surface of a second material that forms an etching mask for a first material, with the trench being of a depth that extends to the surface of the first insulation layer and two side faces of a portion of the semiconductor layer having a predetermined width being exposed in the trench; a step of using the first material to bury and planarize the trench; and a step of using a transverse plane geometry pattern that cuts across a portion having the predetermined width to remove material from the trench other than the first material portion and leave an island of the first material.

In accordance with an eighth principal point of the present invention, the manufacturing method includes a step of forming on the side faces of the semiconductor layer exposed in the trench, a second insulation layer that forms an etching mask for the first material.

In accordance with a ninth principal point of the present invention, the manufacturing method includes a step of introducing impurity from a side face of the semiconductor layer portion, using the first material island portion as a mask.

In accordance with a tenth principal point of the present invention, the manufacturing method includes a step of using a third insulation material to planarize the trench except for the first material island portion.

Further features of the invention, its nature and various advantages will be more apparent from the accompanying drawings and following detailed description of the invention.

DESCRIPTION OF THE PREFERRED EMBODIMENT

Figure 1:
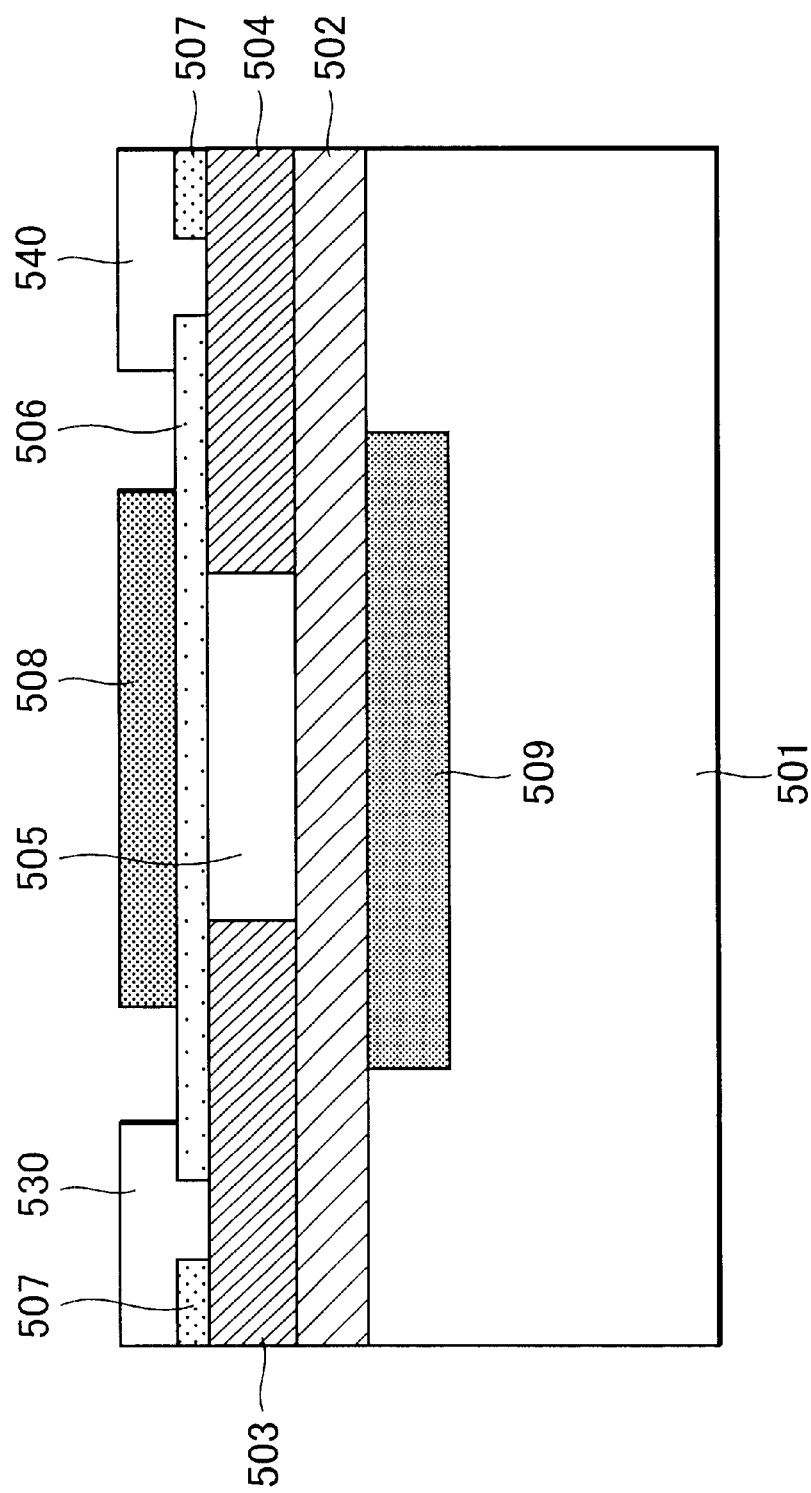
FIG. 1 is a cross-sectional drawing of a conventional double-gate field-effect transistor.
Figure 2:
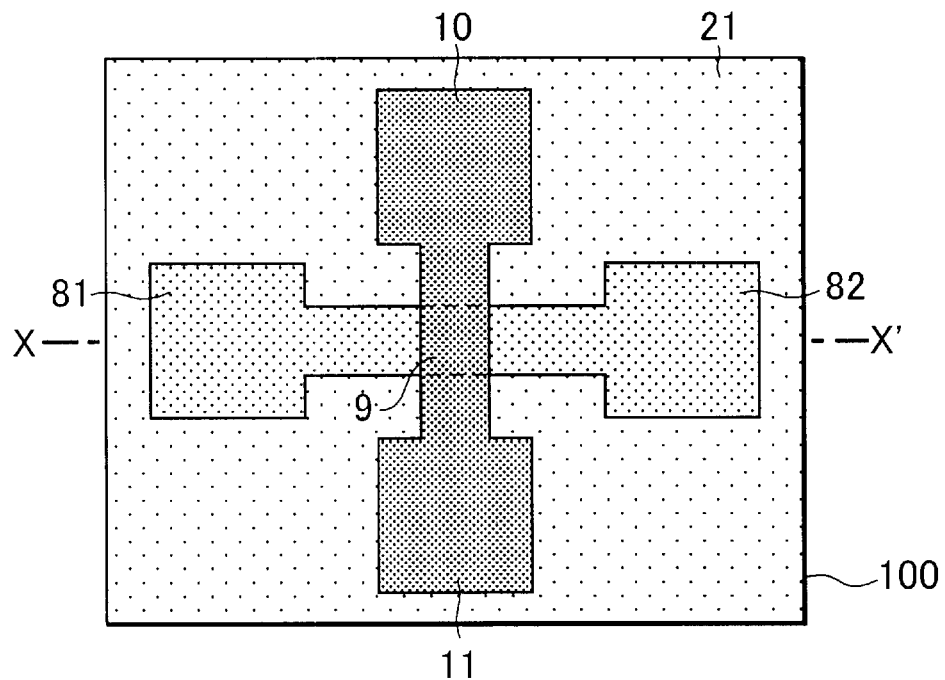
FIG. 2 is a drawing showing a plan view of a double-gate field-effect transistor according to the present invention.
Figure 3:
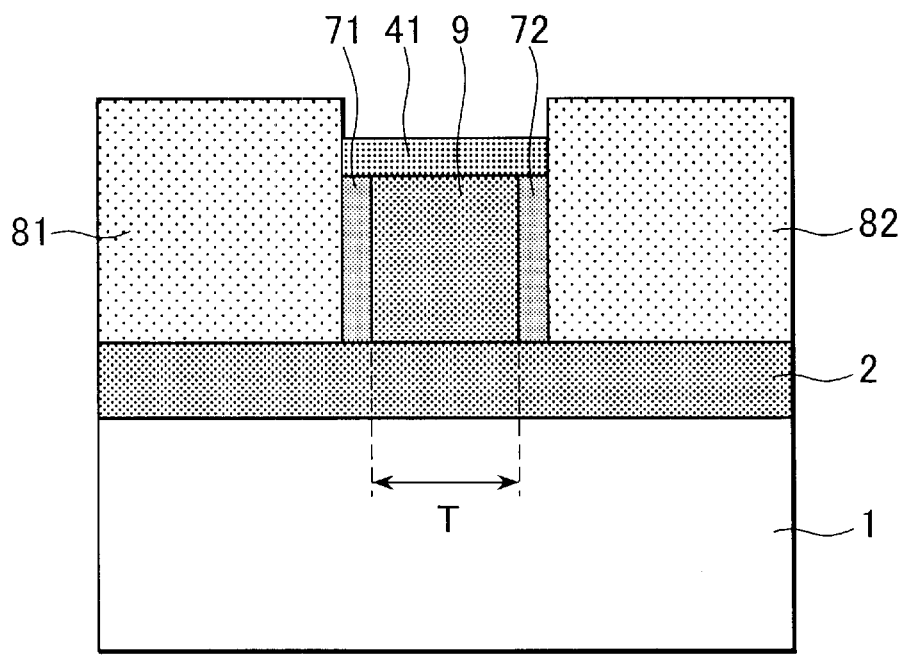
FIG. 3 is a drawing showing a cross-sectional view of the double-gate field-effect transistor of the present invention.
Figure 5:
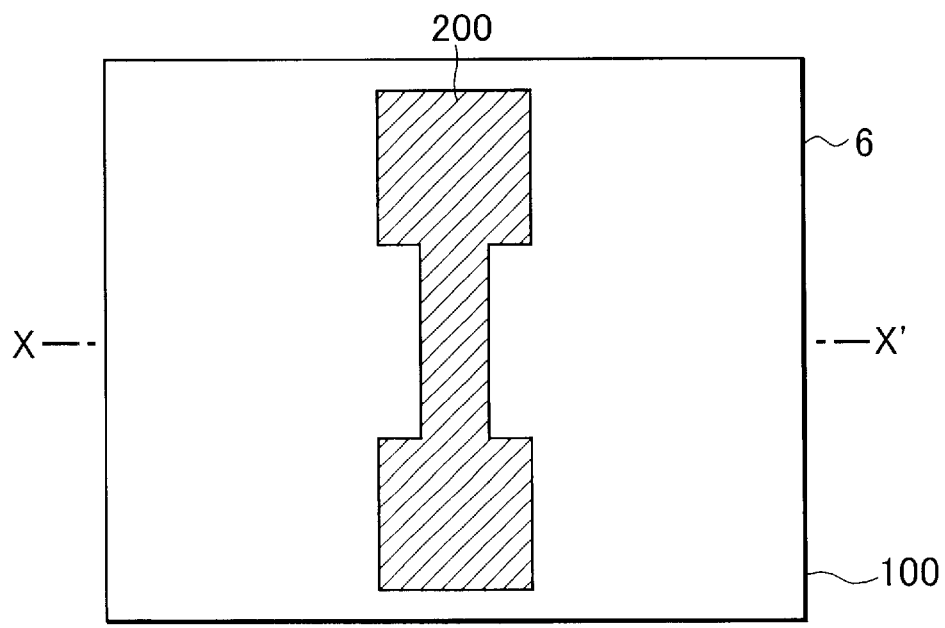
FIG. 5 illustrates a fabrication step used in the first example of the invention.
Figure 6:
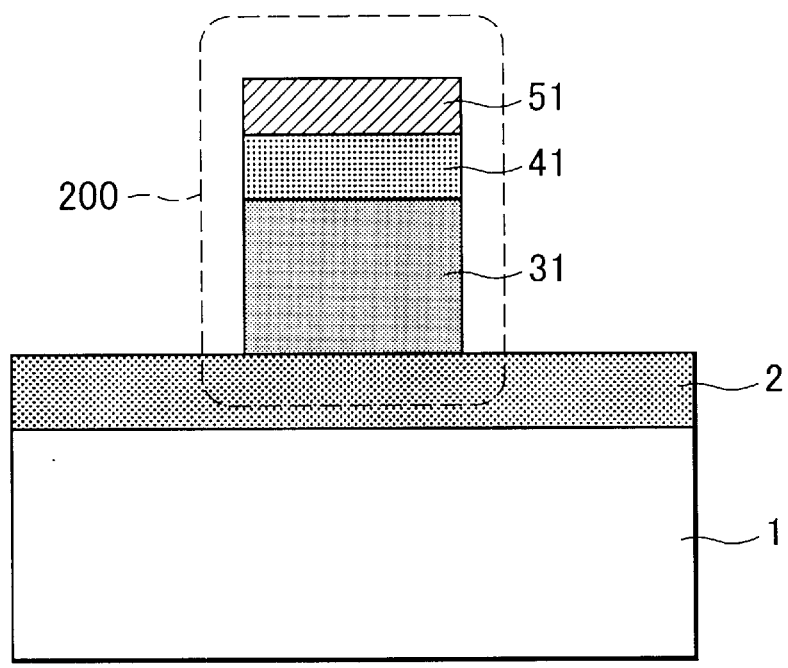
FIG. 6 is a cross-sectional drawing along line X–X' of FIG. 5, illustrating a fabrication step used in the first example of the invention.

As described in the foregoing, with the conventional double-gate field-effect transistor structure in which the vertically arranged gate electrodes, together with the source and drain regions, are provided on the same principal surface, self-alignment cannot be employed, making it difficult to form the two gate electrodes in alignment with the channel, source and drain regions. In contrast, the present invention provides the double-gate field-effect transistor having the structure shown in the plan view of FIG. 2 and the cross-sectional view of FIG. 3, in which the section is through line X–X' of FIG. 2. In FIG. 3, an insulation film 2 is provided on a substrate 1. A semiconductor island region is formed on the insulation film 2, and is used to form, in a trench 6 (FIG. 5), a separate channel region 9, source region 10 and drain region 11. Here, in the horizontal direction of FIG. 3, the channel region 9 has a predetermined thickness that is at least T. The transistor also includes two gate insulation films 71 and 72 provided on side faces of the channel region 9, and two gate electrodes 81 and 82 that are separated in the trench 6 by the semiconductor-layer island. Outside the trench 6, there is a residual portion 100 of a semiconductor crystal layer 3, provided on the insulation film 2. Frequently, after the trench 6 is formed it is partially filled with material such as insulation material 21, but it is still referred to as a trench.

It is possible to use self-alignment process to suppress positional deviation between the channel region and the two gate electrodes. CMP-based planarizing techniques such as the damascene process can be used as a manufacturing method in which self-alignment process is used to realize this structure.

EXAMPLE 1

Figure 4:
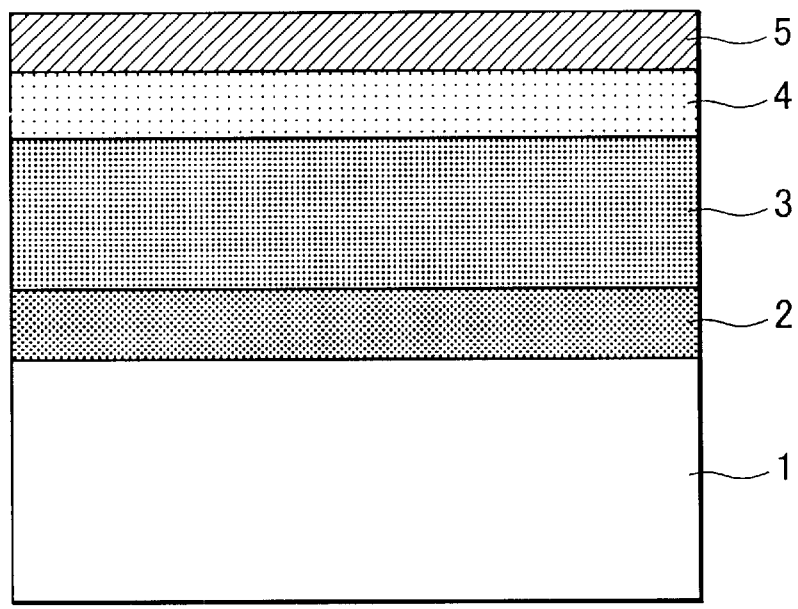
FIG. 4 illustrates a fabrication step used in a first example of the invention.

The sequence of steps comprising this procedure is shown in FIGS. 4 to 15. First, as shown in FIG. 4, a silicon oxide insulation film 2 is formed on a silicon substrate 1, and the silicon thus formed is used to provide a semiconductor crystal layer 3, followed by a silicon oxide film 4 and a silicon nitride film 5, in that order. Next, with reference to FIGS. 5 and 6, part of the silicon nitride film 5, silicon oxide film 4 and semiconductor crystal layer 3 is removed to form a trench 6 that isolates a layer island 200 from the surrounding portion. Here, the residual portion 100 is part of the semiconductor crystal layer 3, and silicon layer 31, silicon oxide film 41 and silicon nitride film 51 are the remaining parts of the semiconductor crystal layer 3, silicon oxide film 4 and silicon nitride film 5, respectively, that comprise the island 200.

Figure 7:
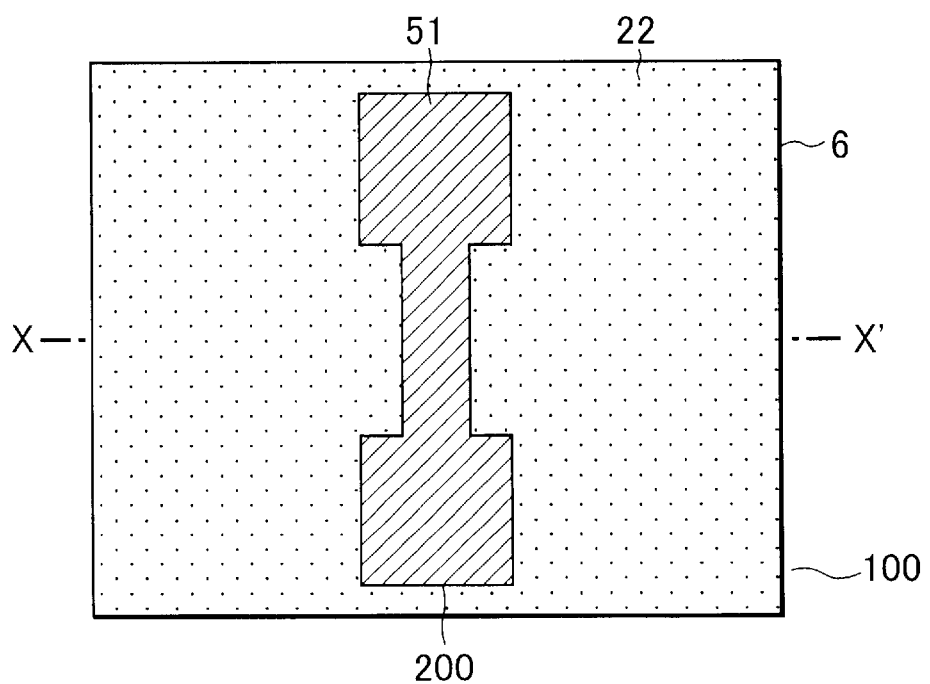
FIG. 7 illustrates a fabrication step used in the first example of the invention.
Figure 8:
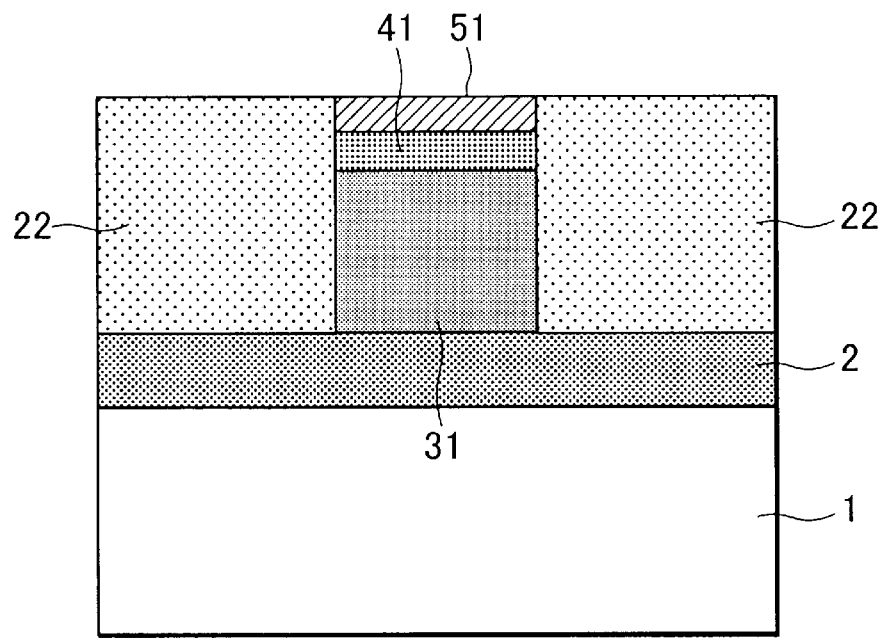
FIG. 8 is a cross-sectional drawing along line X–X' of FIG. 7, illustrating a fabrication step used in the first example of the invention.
Figure 9:
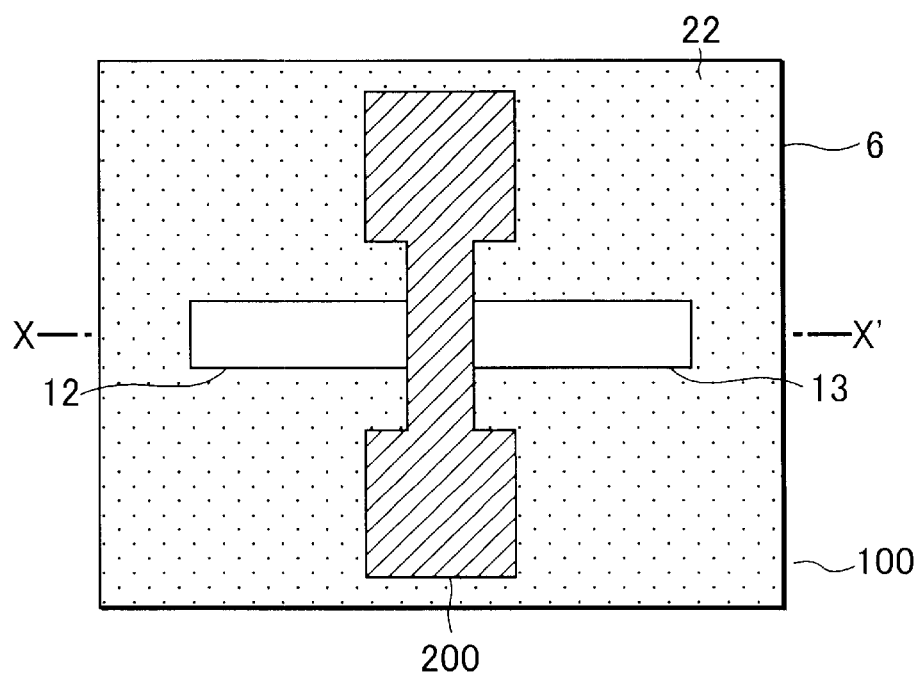
FIG. 9 illustrates a fabrication step used in the first example of the invention.

As shown in FIG. 7, a silicon oxide film 22 is embedded in the trench 6 and is planarized by CMP or the like. FIG. 8 is a cross-sectional view along the line X–X' of FIG. 7. With reference to FIG. 9, the silicon oxide film 22 is removed to at least a depth that is sufficient to reach the surface of the insulation film 2, to form trenches 12 and 13 that follow the gate electrode pattern. The trenches 12 and 13 are formed using a single pattern that cuts across the island 200. The silicon oxide film 22 is removed by etching, at which time the surface of the island is exposed to the etchant. However, the silicon nitride film 5 acts as an etching mask, preventing the removal of the island layer that afterwards becomes the channel region 9.

Figure 10:
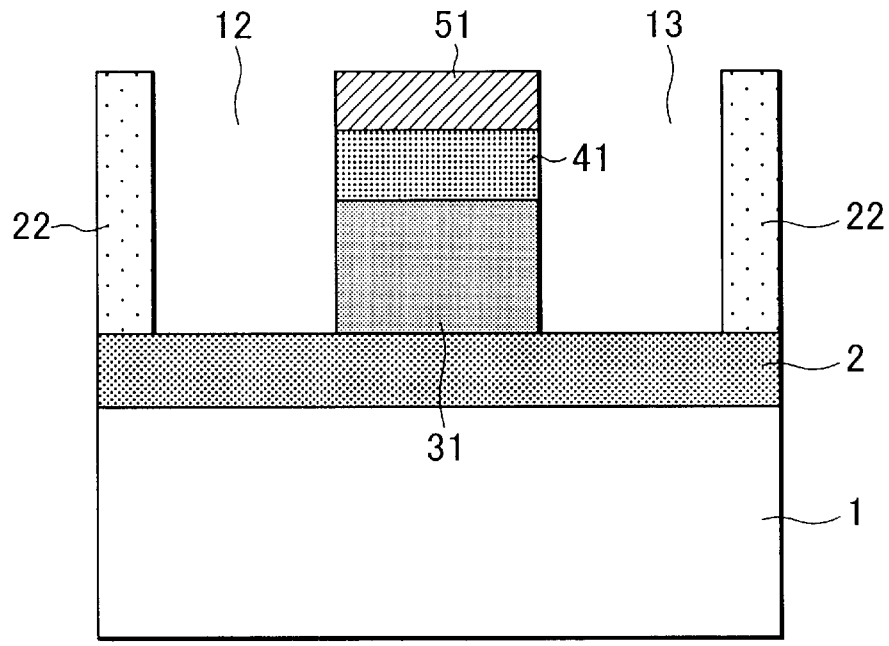
FIG. 10 is a cross-sectional drawing along line X–X' of FIG. 9, illustrating a fabrication step used in the first example of the invention.
Figure 11:
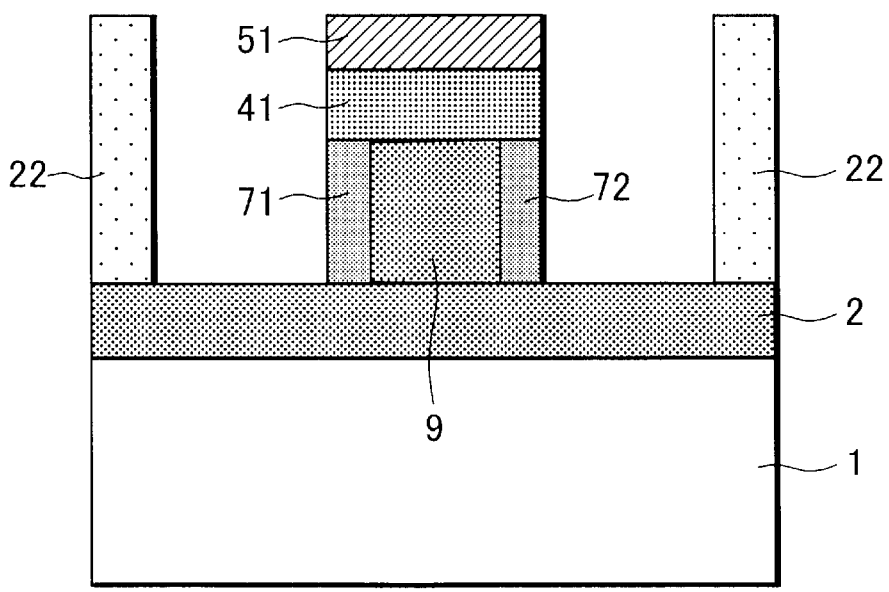
FIG. 11 illustrates a fabrication step used in the first example of the invention.
Figure 12:
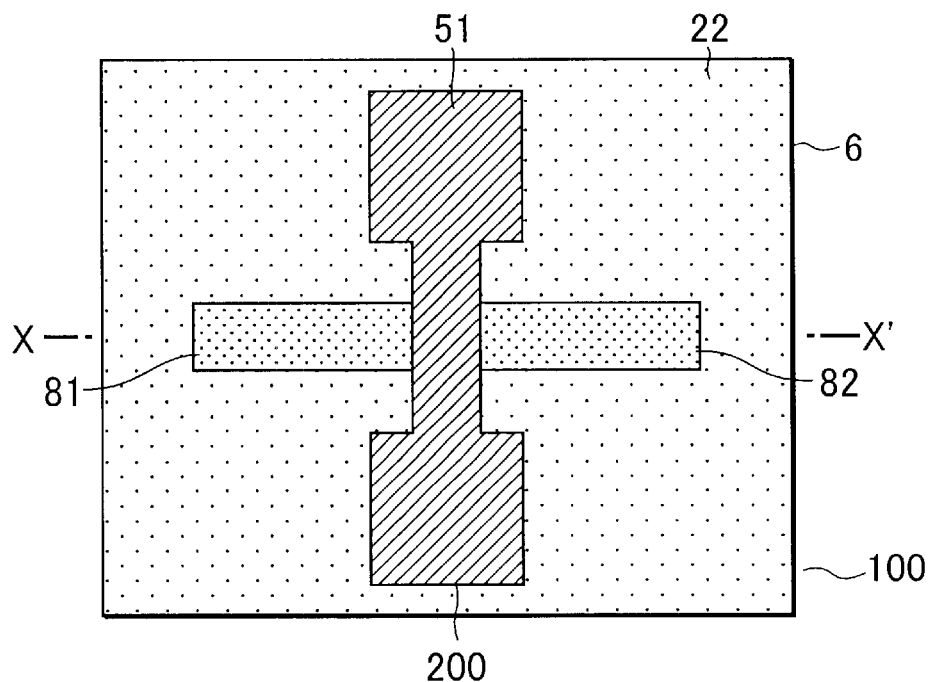
FIG. 12 illustrates a fabrication step used in the first example of the invention.
Figure 13:
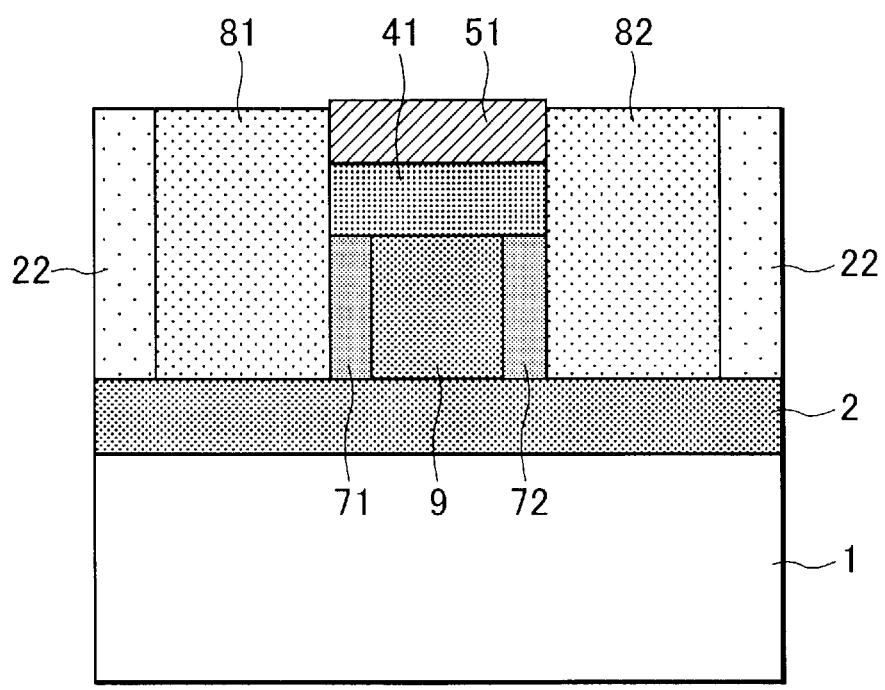
FIG. 13 is a cross-sectional drawing along line X–X' of FIG. 12, illustrating a fabrication step used in the first example of the invention.
Figure 14:
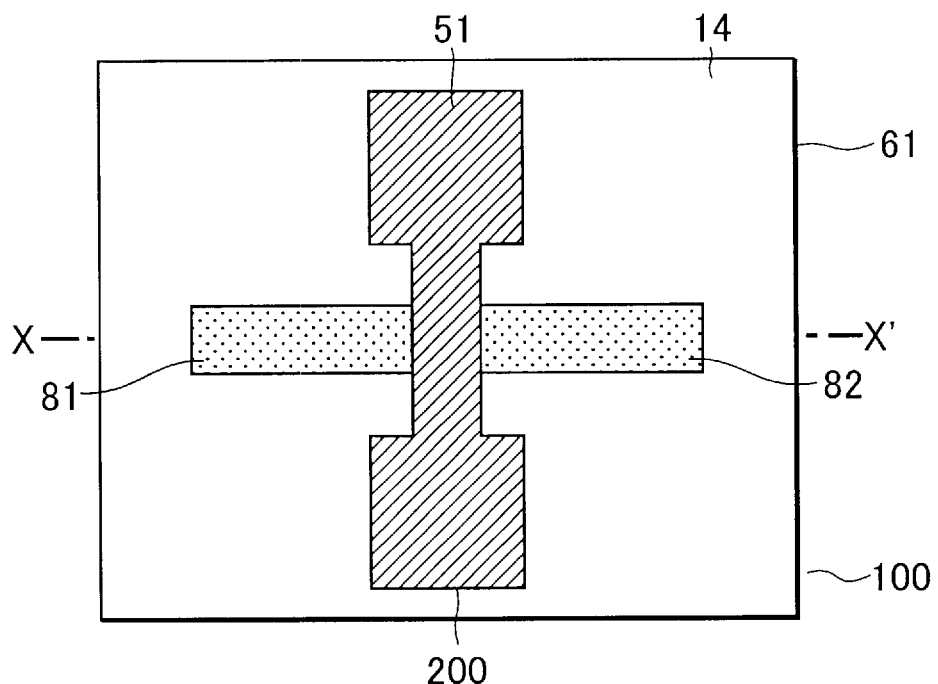
FIG. 14 illustrates a fabrication step used in the first example of the invention.

FIG. 10 is a cross-sectional view along line X–X' of FIG. 9. As shown in FIG. 11, the sides of the silicon layer 31 exposed in the trenches 12 and 13 are oxidized to form a silicon oxide film comprising gate insulation films 71 and 72. Next, as shown in FIG. 12, a polycrystalline silicon layer is deposited over the entire surface, which is planarized using CMP or the like, and polycrystalline silicon to form gate electrodes 81 and 82 is embedded in the trenches 12 and 13. At this time, the silicon nitride film 5 and 51 remaining on top of the island 200 acts as an etching stop in the planarization process. FIG. 13 is a cross-sectional view along line X–X' of FIG. 12.

Figure 15:
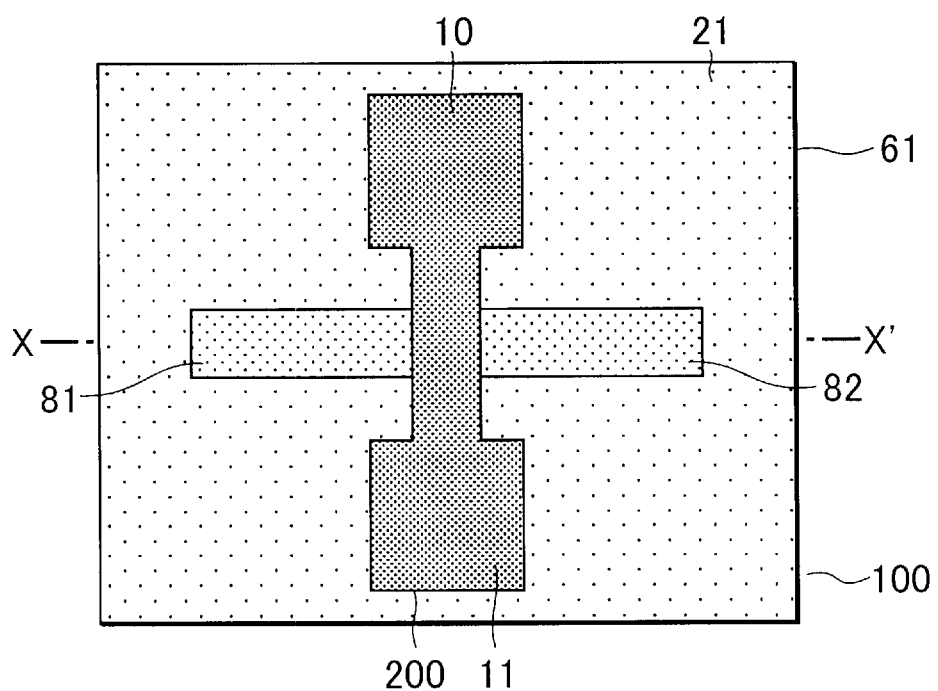
FIG. 15 illustrates a fabrication step used in the first example of the invention.

Next, the silicon oxide film 22 is removed, forming a trench 61 in which remains polycrystalline silicon used to form the gate electrodes 81 and 82 in the trench 6. By using the remanent polycrystalline silicon as a diffusion mask, high-concentration n-type impurity is diffused from the side face, forming the source region 10 and drain region 11 in the island 200. The masked portion of the silicon layer 31 in FIG. 6 forms channel region 9 in FIG. 3. At the same time, high-concentration n-type impurity is also added to the polycrystalline silicon layer that is used to form the gate electrodes 81 and 82, thereby decreasing the resistance thereof. Next, as shown by FIG. 15, silicon oxide film 21 is embedded in the trench 6 and planarized using CMP or the like. Thus, the same principal surface is provided with source region 10, drain region 11, channel region 9 and gate electrodes 81 and 82, formed using a self-aligning process, enabling the double-gate field-effect transistor of FIGS. 2 and 3 to be achieved in which isolation is provided by the insulation material 21.

EXAMPLE 2

Figure 16:
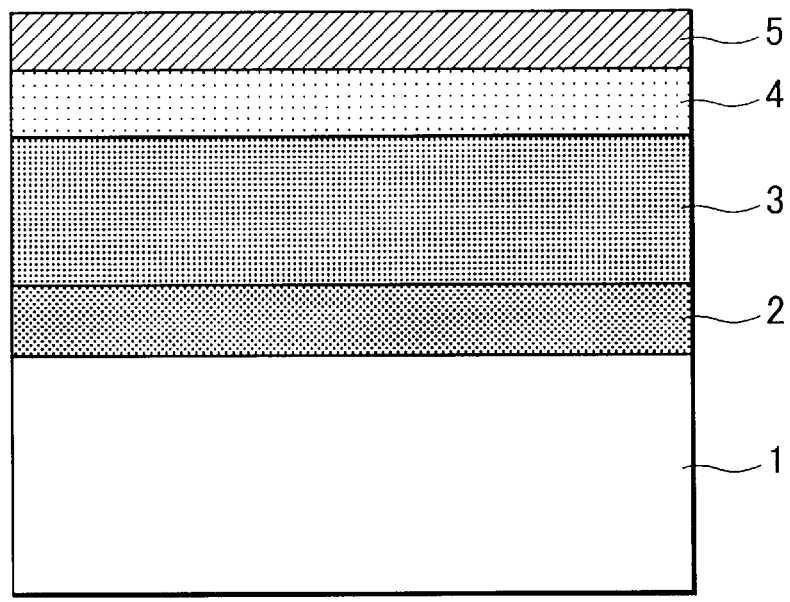
FIG. 16 illustrates a fabrication step used in a second example of the invention.
Figure 17:
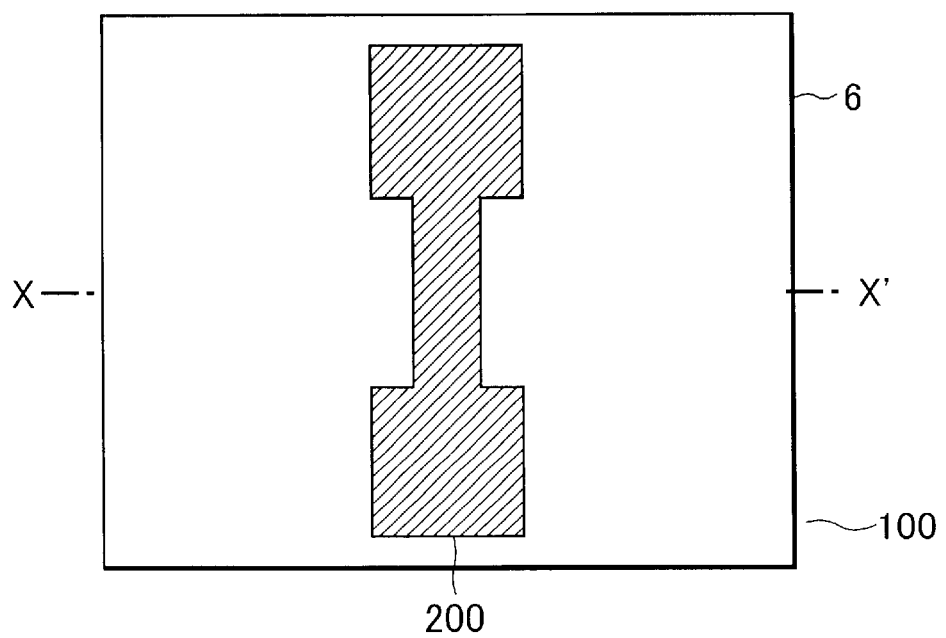
FIG. 17 illustrates a fabrication step used in the second example of the invention.

Another preferred embodiment of the method for manufacturing the double-gate field-effect transistor according to the present invention is shown in FIGS. 16 to 24. First, as shown in FIG. 16, a silicon oxide insulation film 2 is formed on a silicon substrate 1, and the silicon thus formed is used to provide a semiconductor crystal layer 3, on which are formed a silicon oxide film 4 and a silicon nitride film 5, in that order. Next, with reference to FIGS. 17 and 18, part of the silicon nitride film 5, silicon oxide film 4 and semiconductor crystal layer 3 is removed to form a trench 6 that isolates a layer island 200 from the surrounding portion. Here, the residual portion 100 is part of the semiconductor crystal layer 3, and silicon layer 31, silicon oxide film 41 and silicon nitride film 51 are the remaining parts of the semiconductor crystal layer 3, silicon oxide film 4 and silicon nitride film 5, respectively, that comprise the island 200. Up to this point, the process method is the same as that of Example 1.

Figure 18:
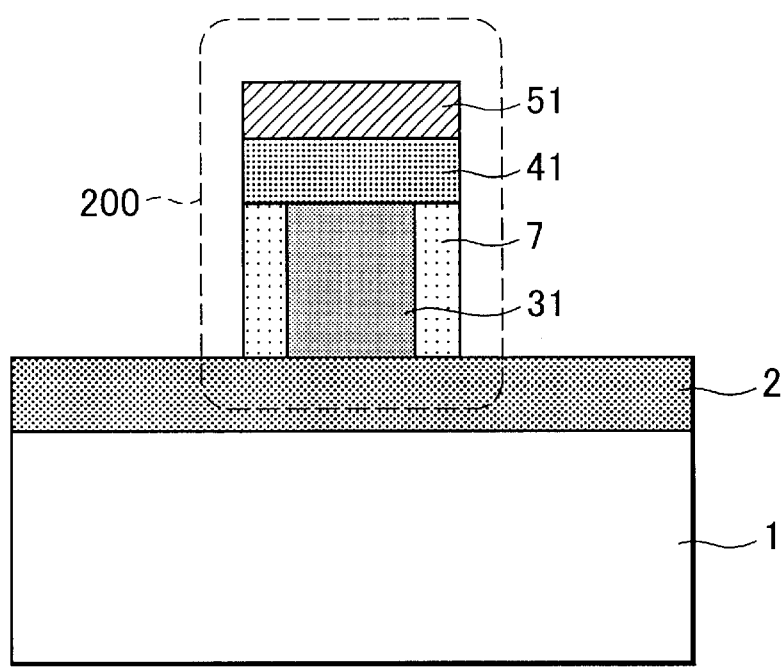
FIG. 18 illustrates a fabrication step used in the second example of the invention.

Next, with reference to FIG. 18, thermal oxidation process or the like is used to form a silicon oxide film 7 on the sides of the silicon layer exposed in the trench. Silicon nitride film 51 acts as a film that prevents the progress of oxidation of the silicon layer surface. The surrounding silicon crystal layer side portions exposed in the trench 6 are also oxidized at this time, although this is not shown. The island can be set at different widths for each device.

Figure 19:
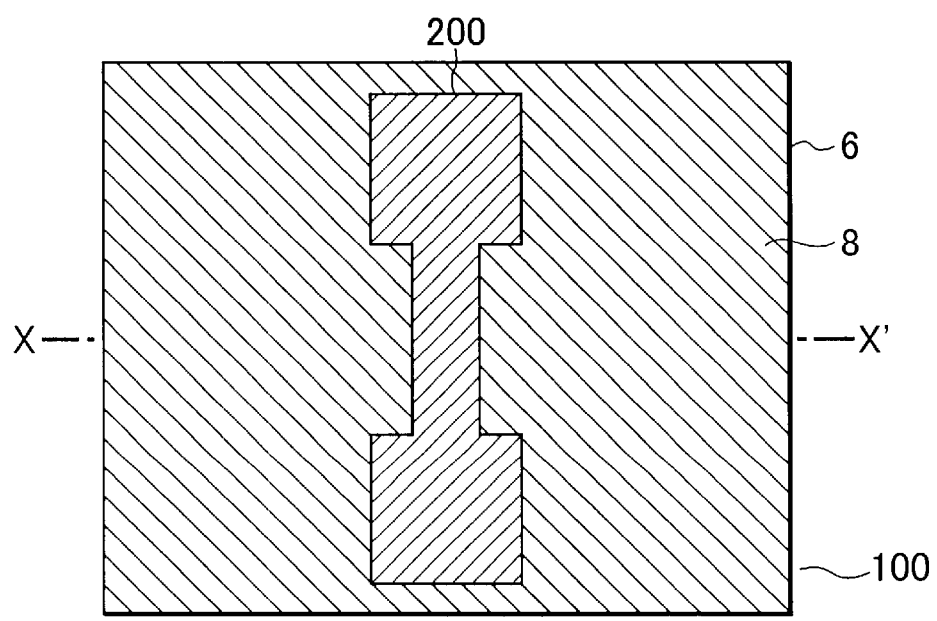
FIG. 19 illustrates a fabrication step used in the second example of the invention.

Next, as shown in FIG. 19, a polycrystalline silicon layer 8 is embedded in the trench 6 and is subjected to a first planarization process by CMP or the like. While in Example 1 it was a silicon oxide film that was embedded, in this Example 2 polycrystalline silicon is used. The silicon nitride film on the island 200 and residual portion 100 acts as an etching stop film in the planarization process.

Figure 20:
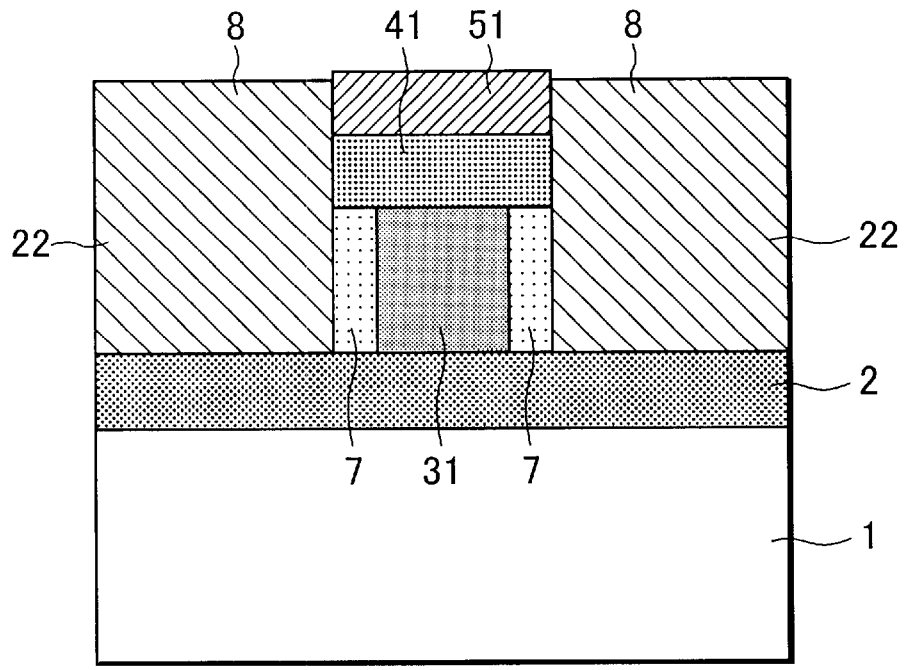
FIG. 20 is a cross-sectional drawing along line X–X' of FIG. 19, illustrating a fabrication step used in the second example of the invention.

FIG. 20 is a cross-sectional view along the line X–X' of FIG. 19. The polycrystalline silicon layer 8 is selected based on the material properties of being able to withstand the high-temperature heating process used in subsequent steps such as the impurity diffusion step, and because a silicon nitride film can be used as an etching mask. Also, it is desirable to be able to impart conductivity to the gate electrodes. Therefore, any material having these characteristics can be used.

Figure 21:
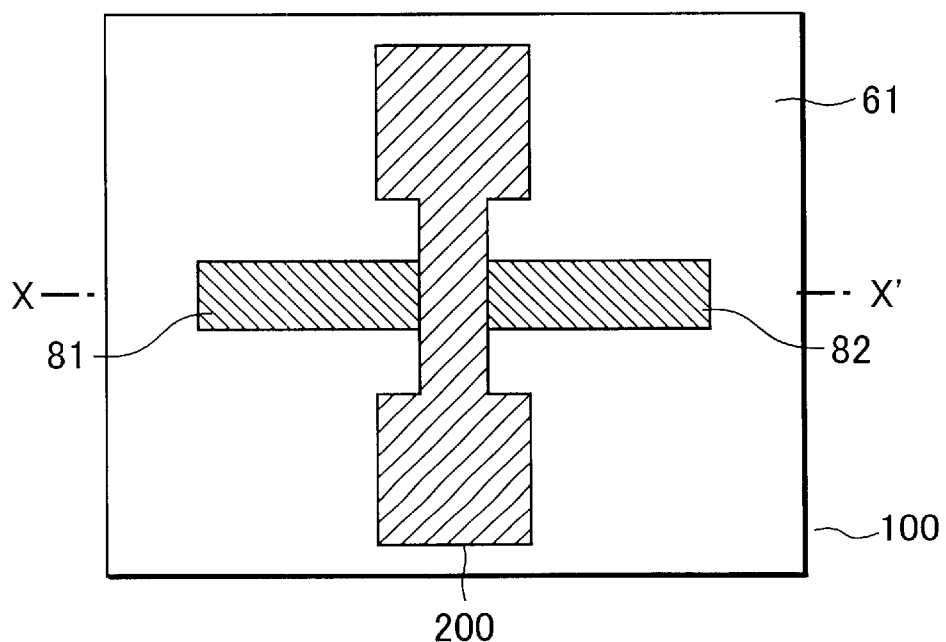
FIG. 21 illustrates a fabrication step used in the second example of the invention.

Next, with reference to FIG. 21, in accordance with the gate electrode pattern, residual portions of the polycrystalline silicon layer 8 in the trench 6 are removed, leaving the polycrystalline silicon layer 8 used to form the gate electrodes 81 and 82. The polycrystalline silicon layer used to form the gate electrodes 81 and 82 is formed using a single pattern that cuts across the island 200, eliminating variations in the mutual positional relationship. The polycrystalline silicon 8 is removed by etching, at which time the portion of the surface of the island 200 that is not protected by a resist 300 is also exposed to the etchant. However, the silicon nitride film acts as an etching mask, preventing the removal of the exposed portion of the island layer, which is the portion that afterwards forms the source and drain regions. This also applies to outside parts of the trench 6 that are not protected. Etching into the sides of the silicon layer that face into the trench 6 is prevented by the masking effect of the silicon oxide film 7 formed beforehand, so the shape is maintained.

Figure 22:
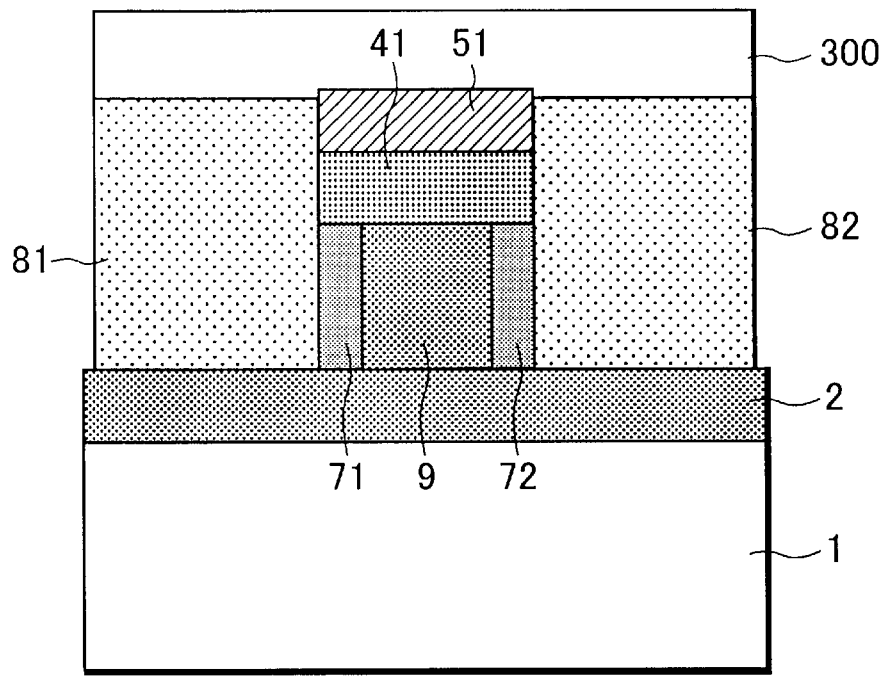
FIG. 22 is a cross-sectional drawing along line X–X' of FIG. 21, illustrating a fabrication step used in the second example of the invention.

FIG. 22 is a cross-sectional drawing along line X–X' of FIG. 21. The resist 300 is for forming the polycrystalline silicon layer used to form the gate electrodes 81 and 82. The portions of the silicon oxide film 7 in contact with the polycrystalline silicon layer are gate insulation films 71 and 72, and the part of the silicon layer 31 between the portions of the polycrystalline silicon layer used to form the gate electrodes 81 and 82 is the channel region 9. Next, after removing the resist 300, with the polycrystalline silicon layer used to form the gate electrodes 81 and 82 being used as a mask, the silicon oxide film 7 on the sides of the silicon layer 31 is removed.

High-concentration n-type impurity is diffused from the side face to form the source region 10 and drain region 11 in the silicon layer 31 of the island 200. Part of the masked silicon layer 31 becomes channel region 9. At the same time, high-concentration n-type impurity is also added to the polycrystalline silicon layer that is used to form the gate electrodes 81 and 82, decreasing the resistance of the electrodes.

Figure 23:
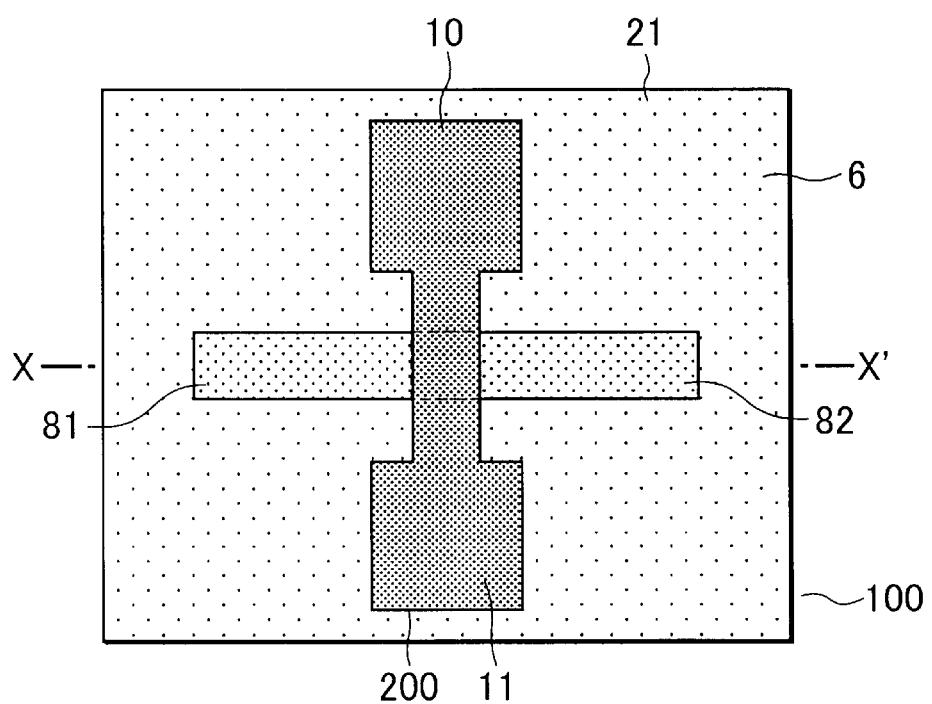
FIG. 23 illustrates a fabrication step used in the second example of the invention.
Figure 24:
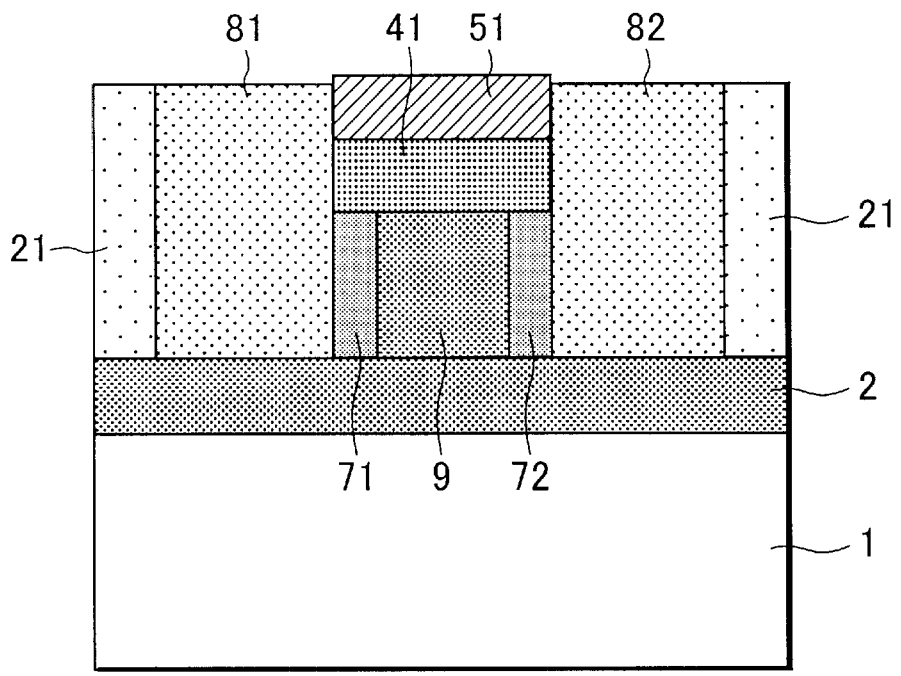
FIG. 24 is a cross-sectional drawing along line X–X' of FIG. 23, illustrating a fabrication step used in the second example of the invention.

Next, as shown in FIG. 23, silicon oxide 21 is embedded in the trench 6 and planarized using CMP or the like. FIG. 24 is a cross-sectional drawing along line X–X' of FIG. 23. In this way, a double-gate field-effect transistor is formed having the structure shown in the plan view of FIG. 2 and the sectional view of FIG. 3. Thus, the same principal surface is provided with a source region 10, drain region 11, channel region 9 and gate electrodes 81 and 82, which are formed using a self-alignment process, enabling the double-gate field-effect transistor of FIGS. 2 and 3 to be achieved in which isolation from the remanent portion 100 is provided by silicon oxide film 21. From the foregoing description, it can be seen that in the case of this embodiment, only two planarization steps are required, one fewer than the three required in the case of Example 1.

EXAMPLE 3

Figure 25:
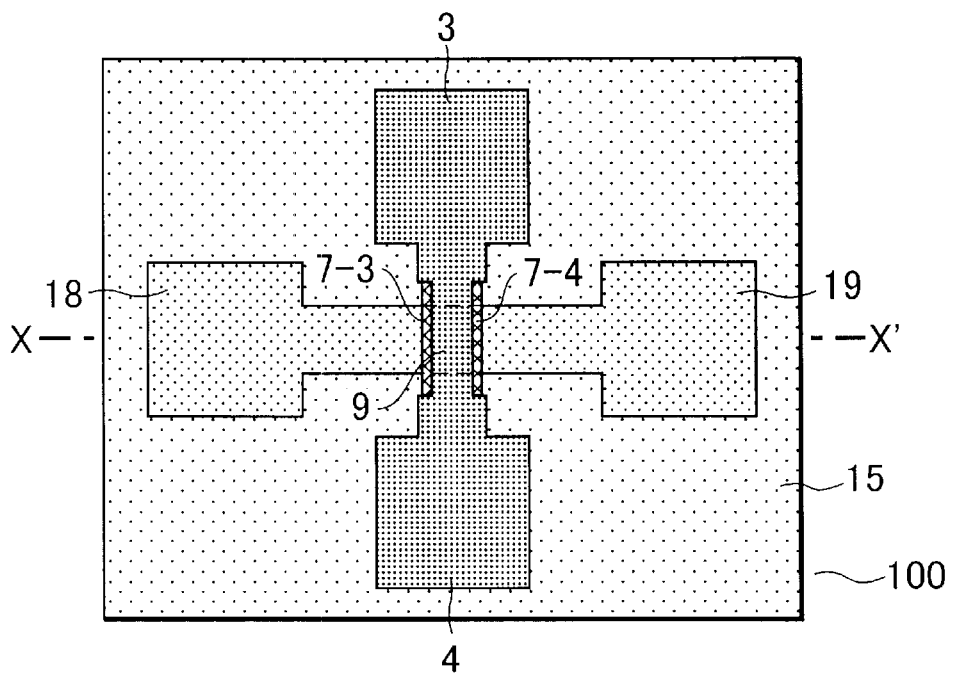
FIG. 25 is a drawing showing a plan view of a double-gate field-effect transistor according to a third example of the present invention.

An example of a double-gate field-effect transistor comprising another embodiment of the invention will now be described. In this transistor, the width of the channel region is further decreased, enabling a marked suppression of the short channel effect. If the channel region is made thin enough, the result is a fully-depleted type transistor, making it possible to improve the transistor characteristics. FIG. 25 shows a plan view of the double-gate field-effect transistor with the reduced-width channel region, and FIG. 26 shows a cross-sectional view.

Figure 26:
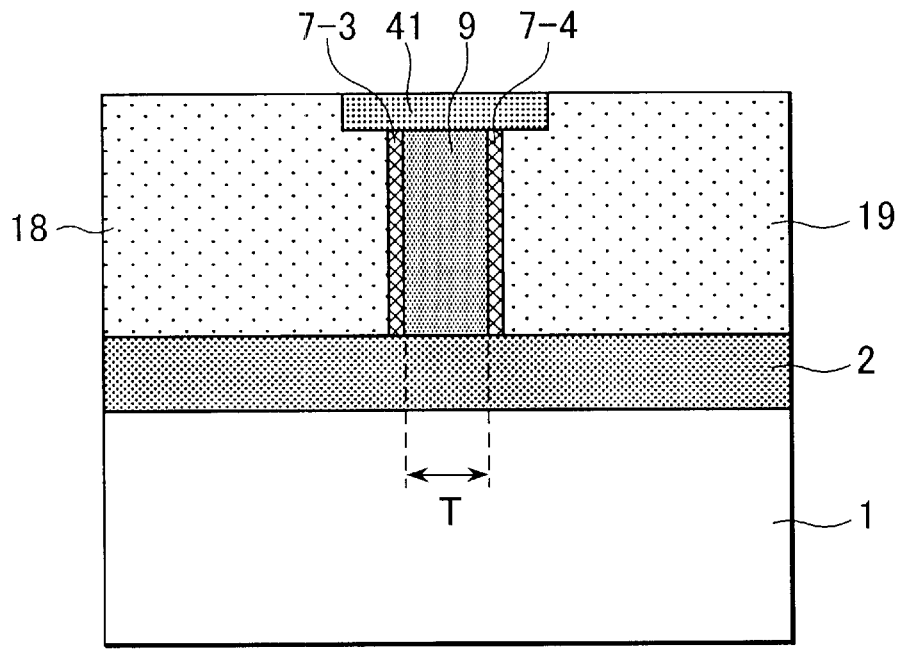
FIG. 26 is a drawing showing a cross-sectional view of a double-gate field-effect transistor according to the third example of the present invention.
Figure 27:
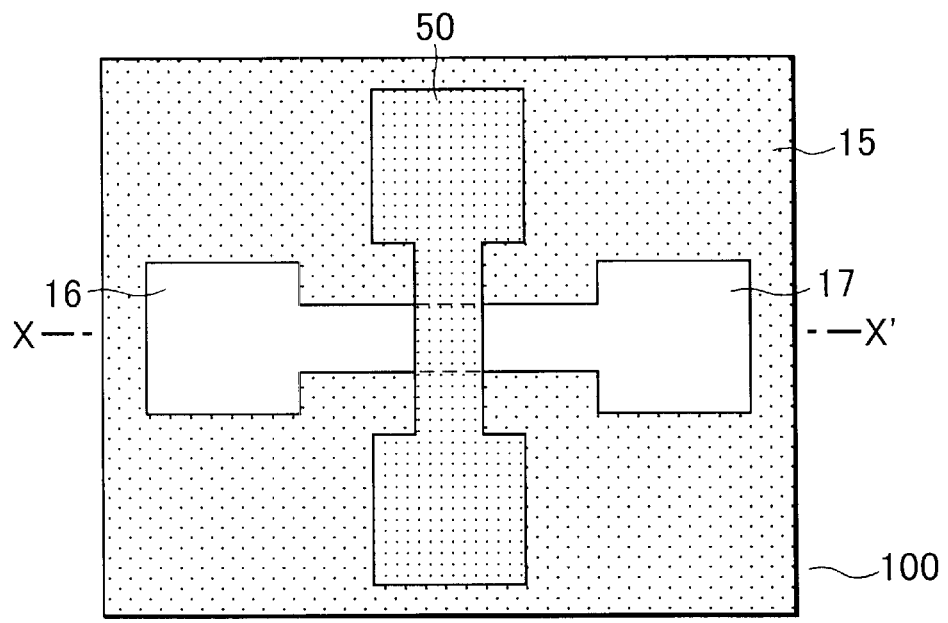
FIG. 27 illustrates a fabrication step used in the third example of the invention.
Figure 28:
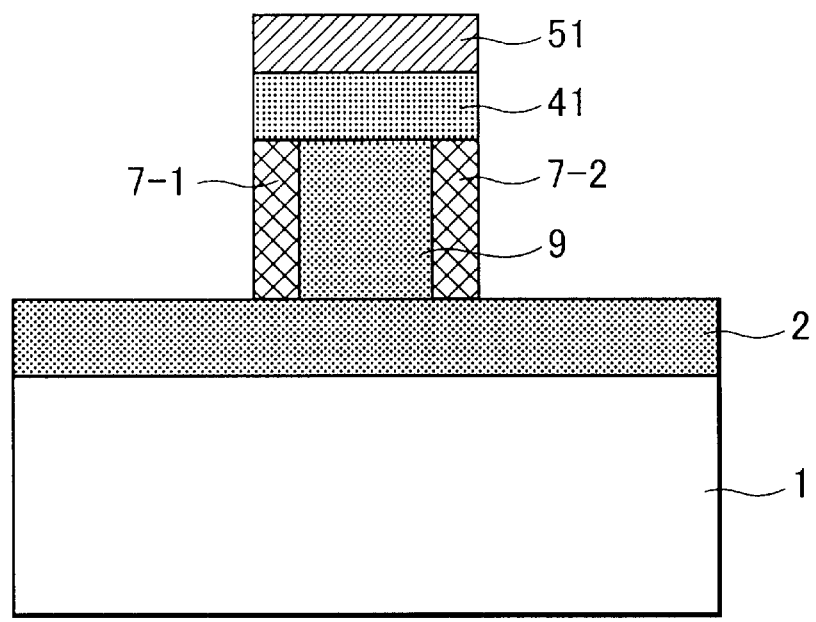
FIG. 28 is a cross-sectional drawing along line X–X' of FIG. 27, illustrating a fabrication step used in the third example of the invention.
Figure 29:
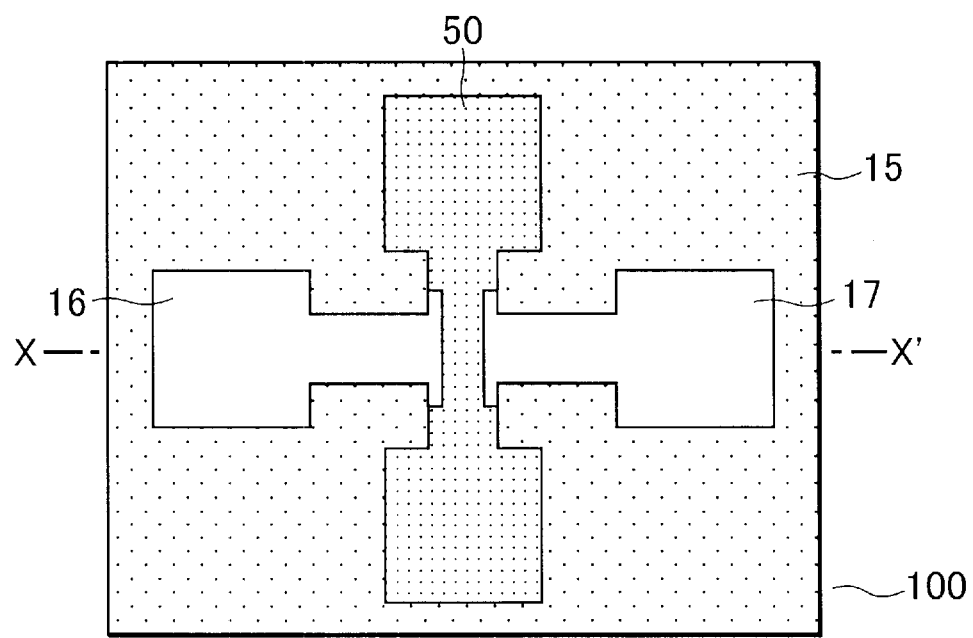
FIG. 29 illustrates a fabrication step used in the third example of the invention.
Figure 30:
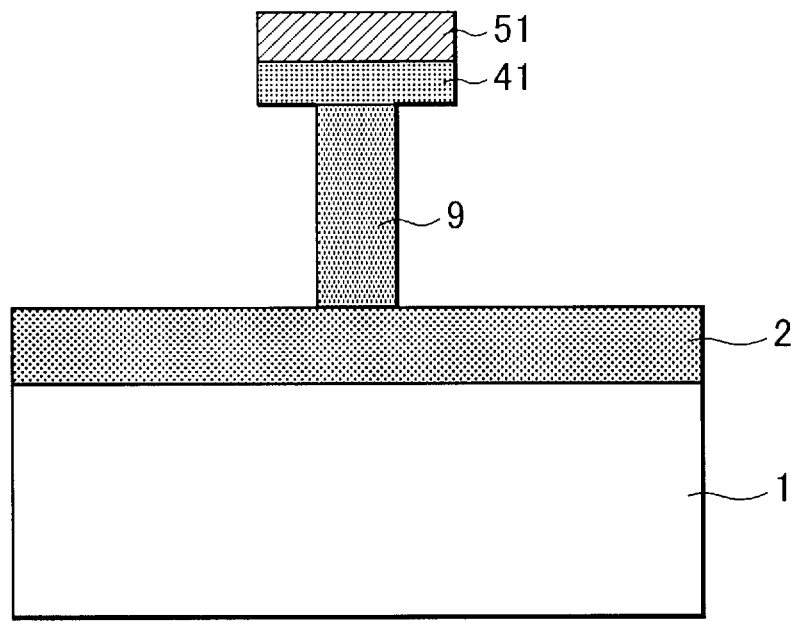
FIG. 30 is a cross-sectional drawing along line X–X' of FIG. 29, illustrating a fabrication step used in the third example of the invention.

The steps of manufacturing the transistor shown in FIGS. 25 and 26 are shown in FIGS. 27 and 28. After achieving the shape shown, with reference to Example 2, in FIG. 23, polycrystalline silicon layers 18 and 19 are removed to form the trenches 16 and 17 of FIG. 27. FIG. 28 is a cross-sectional view along line X–X' of FIG. 27. Silicon oxide films 7-1 and 7-2 are removed from the side faces of the exposed channel region 9 shown in FIG. 28. Then, using a known process, the side faces of the channel region 9 are etched to decrease the width of the channel to a predetermined width. FIG. 30 is a cross-sectional view through line X–X' of FIG. 29.

Figure 31:
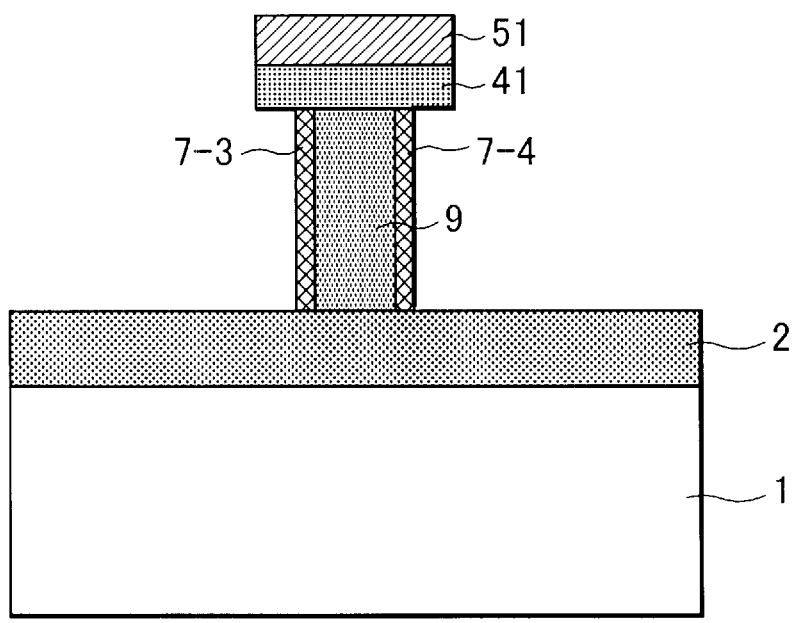
FIG. 31 illustrates a fabrication step used in the third example of the invention.
Figure 32:
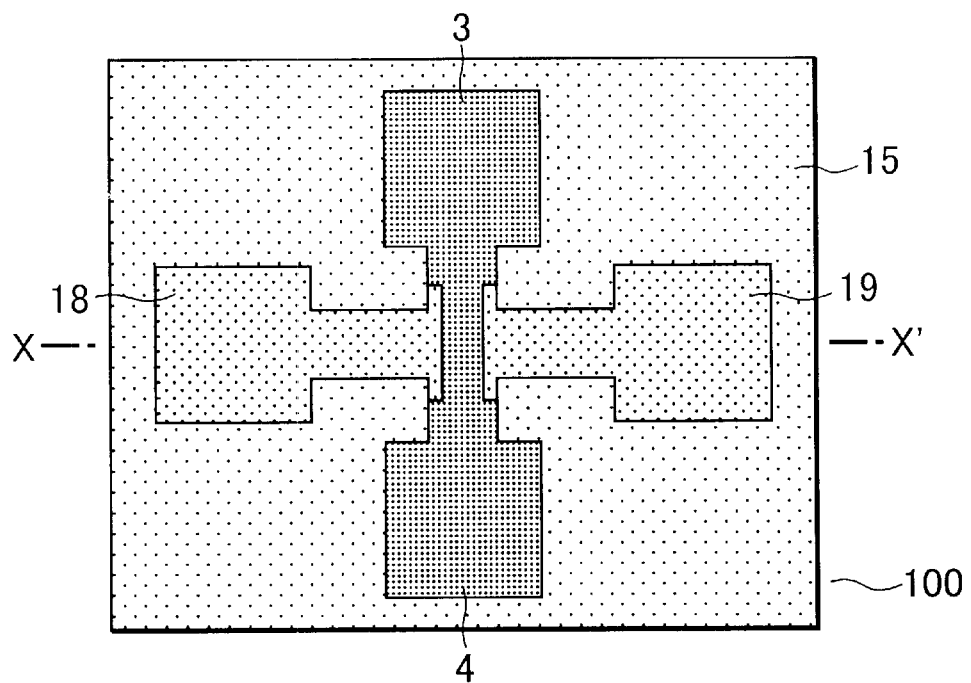
FIG. 32 illustrates a fabrication step used in the third example of the invention.
Figure 33:
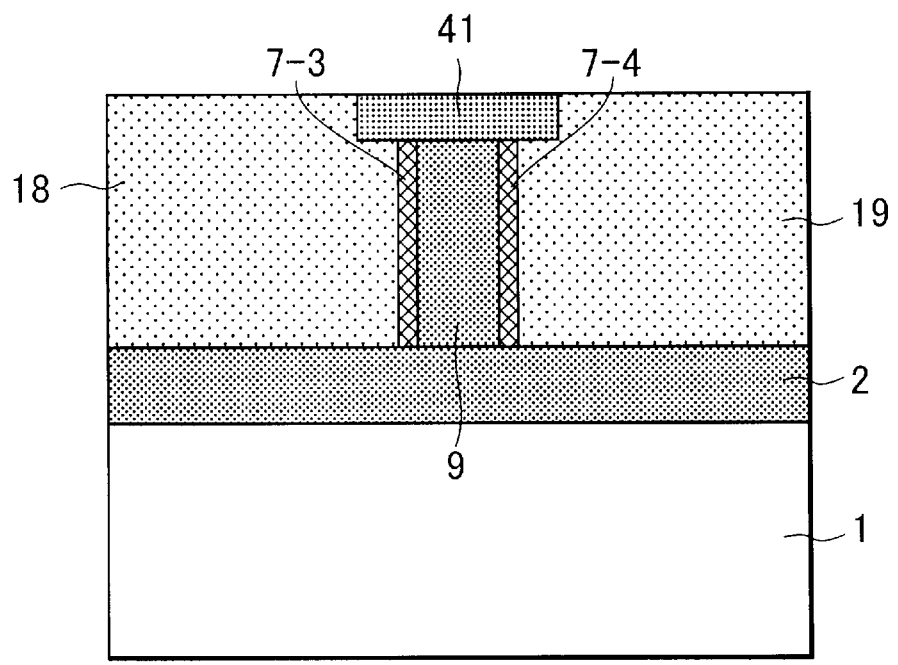
FIG. 33 is a cross-sectional drawing along line X–X' of FIG. 32, illustrating a fabrication step used in the third example of the invention.

Next, as shown in FIG. 31, a known process is used to form, on the side faces, silicon oxide films 7-3 and 7-4 that will form gate oxide films. Silicon nitride film 51 is then removed, and metal or metal silicide is used to bury and planarize the trenches 16 and 17, as shown in FIG. 32, thereby forming gate electrodes 18 and 19. FIG. 33 is a cross-sectional view through line X–X' of FIG. 32. Thus, source region 10, drain region 11, channel region 9 reduced to a predetermined width, and reduced-resistance gate electrodes 18 and 19 are all formed self-aligned on the same principal surface, providing a structure that enables the double-gate field-effect transistor shown in FIGS. 25 and 26 to be achieved. To enable the diffusion layer sheet resistance and contact resistance to be decreased, the width of the source region 10 and drain region 11 can be increased independently of the width of the channel region. This makes it possible to reduce the effect of variations in parasitic resistance arising from error in the positional alignment of the polycrystalline silicon layer that forms the gate electrodes 18 and 19, and the island 50 used to form the source and drain regions.

While the preferred embodiments of the present invention have been described with reference to three examples, the invention is not limited thereto.

As described in the foregoing, in accordance with the present invention the number of planarizations by CMP or the like can be reduced, which reduces the risk of contamination and decreases manufacturing costs. Also, since the source region, drain region, channel region and gate electrodes are all formed self-aligned on the same principal surface, the double-gate field-effect transistor thus formed can be used to form high-performance integrated circuits. This structure also reduces the complexity of the wiring involved by eliminating the type of wiring layer that were needed for the lower gate electrode in the prior art. Also, via holes in interlayer insulation layers provided on the upper part of the device have virtually the same depth, whether for connections to the source region, drain region, or gate electrodes, providing better process control and reducing the time required for the operations. Moreover, as shown, both gates can be fabricated by the same lithographic process, enabling mutual self-alignment and self-alignment with the source, drain and channel regions. As a result, the inventive structure prevents performance degradation caused by variations in the parasitic resistance of source and drain, or increases in parasitic capacitance arising from lack of alignment precision, as in the prior art.

In addition to operating the transistor by applying the same electric potential to both of the gate electrodes, since the gate electrodes are electrically insulated, one electrode can be used for input while a suitable potential is applied to the other electrode. This makes it possible to provide a field-effect transistor with a controllable threshold voltage. It is also possible to change the width of the channel region on a device-by-device basis, making it possible to change threshold voltages while applying the same electric potential. The principal behind this is that increasing the width of the channel region decreases the capacitance of the silicon layer, reducing the capacitance between the channel surface facing one gate electrode and the other gate electrode. That is, the thicker the channel region is, the smaller the degree by which it is possible to change the threshold voltage. This makes it possible to simultaneously realize devices having different threshold voltages. In the prior art structures the same effect could be achieved by changing the thickness of the semiconductor, but this required complex lithographic processes. In contrast, in the case of the present invention, it is only necessary to change the width of the island layers, which can be done using the same lithographic process.

What is claimed is:

1. A method for manufacturing a semiconductor device, comprising the steps of:

providing a substrate having a semiconductor layer separated by a first insulation layer from said substrate, said semiconductor layer having an etching stop layer thereon;

forming a trench in said semiconductor layer through said etching stop layer, said trench having a depth extending to a surface of said first insulation layer so as to leave a first island portion that comprises a part of said semiconductor layer and a part of said etching stop layer and has a portion of specified width for determining a channel thickness of said semiconductor device, said portion having at least two sides that are exposed to said trench;

forming a second insulation layer on each of side surfaces of said semiconductor layer exposed to said trench;

using a first material to bury said trench and planarizing said trench, with said etching stop layer used as a mask so that said first island portion remains substantially unchanged;

removing said first material from said trench using a plane geometry pattern that cuts across said portion of said first island portion, with said etching stop layer and said second insulation layer used as masks, to leave two second island portions of said first material that face each other across said first island portion in said trench;

removing said second insulation layer from each of the side surfaces of said semiconductor layer, with said second island portions used as masks, to expose the side surfaces to said trench and consequently leave second insulation layers on the side surfaces of said semiconductor layer;

introducing dopant from the side surfaces, with said etching stop layer and said second island portion used as masks;

using a third insulating material to bury said trench; and planarizing said trench, with said first etching stop layer used as a mask.

2. The method according to claim 1, further comprising the steps of:

removing said second island portions and portions of said second insulation layers to form second trenches so that the side surfaces of said semiconductor layer are partially exposed to said second trenches;

etching the partially exposed side surfaces to form a thinner specified width portion on said semiconductor layer;

forming fourth insulation layers on the exposed side surfaces;

using a second material to bury said second trenches; and planarizing said second trenches.

* * * * *